(12) United States Patent
Sawai et al.

(10) Patent No.: US 6,369,489 B1
(45) Date of Patent: Apr. 9, 2002

(54) PIEZOELECTRIC COMPONENT

(75) Inventors: Kunio Sawai, Ishikawa-ken; Hisayuki Hashimoto, Takaoka, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/570,499

(22) Filed: May 13, 2000

(30) Foreign Application Priority Data

May 14, 1999 (JP) .............................. 11-134018

(51) Int. Cl.[7] .............................. H03H 7/54; H03H 9/02
(52) U.S. Cl. .................... 310/326; 310/365; 310/321
(58) Field of Search .................. 310/348, 346, 310/321, 3, 326, 365

(56) References Cited

U.S. PATENT DOCUMENTS

| | | |
|---|---|---|
| 4,437,032 A | 3/1984 | Gelhard |
| 4,666,822 A | 5/1987 | Sinha |
| 5,357,662 A * | 10/1994 | Takagi ..................... 310/365 |
| 5,430,345 A * | 7/1995 | Takahashi ................ 310/348 |
| 5,808,522 A * | 9/1998 | Futakuchi ................ 310/326 |
| 6,093,996 A * | 7/2000 | Daidiai .................... 310/340 |
| 6,117,355 A * | 9/2000 | Yoshizawa ............... 310/365 |

FOREIGN PATENT DOCUMENTS

JP 09181556 A 7/1997

* cited by examiner

*Primary Examiner*—Nestor Ramirez
*Assistant Examiner*—Karen B Addison
(74) *Attorney, Agent, or Firm*—Keating & Bennett, LLP

(57) ABSTRACT

A low-cost piezoelectric component which is efficiently manufactured and which provides excellent electrical characteristics, includes a piezoelectric element, a damping member, a supporting substrate for mounting the piezoelectric element, and a cover member. On a surface of the piezoelectric element, the damping member has a predetermined hardness and a vibrating electrode. In the case of a piezoelectric trap filter, a damping member is provided which has a Shore hardness of about 35 to about 80. In the case of a piezoelectric discriminator, the damping member has a Shore hardness of about 80 to about 100.

18 Claims, 5 Drawing Sheets

PIEZOELECTRIC COMPONENT

BACKGROUND OF THE INVENTION

1. Field of the Invention

The present invention relates to piezoelectric components, and in particular, to a piezoelectric component such as a trap filter for eliminating signal having a specific frequency and a discriminator for discriminating a signal.

2. Description of the Related Art

A Piezoelectric component, such as a trap filter and a discriminator utilizing thickness shear vibration and thickness longitudinal vibration, generally has a structure including a rectangular piezoelectric substrate having vibrating electrodes provided on both surfaces thereof, a case made of alumina for accommodating the piezoelectric substrate, and a lid member for closing the case having the piezoelectric substrate therein. The piezoelectric substrate is supported in the case such that the vibrating portion thereof can freely vibrate. In the piezoelectric component having this structure, since thickness shear vibration occurs in a vibrating mode having a nodal point at the center of the thickness of the piezoelectric substrate, damping members of silicone rubber are respectively applied to the surfaces of the piezoelectric substrate with vibrating electrodes provided thereon so that electrical characteristics such as attenuation, group delay characteristics, and distortion rate are adjusted to have desired values.

Furthermore, in the conventional piezoelectric component, damping members are respectively applied to both surfaces of the piezoelectric substrate, so that application of the damping member has to be performed twice to the piezoelectric substrate. Therefore, the number of manufacturing processes of the piezoelectric component is increased. This results in a problem of increased manufacturing costs of the piezoelectric component.

SUMMARY OF THE INVENTION

To overcome the problems described above, preferred embodiments of the present invention provide a low-cost piezoelectric component having a structure and arrangement that simplifies manufacture and achieves excellent electrical characteristics.

A preferred embodiment of the present invention provides a piezoelectric component including a piezoelectric element having a piezoelectric substrate with vibrating electrodes provided on both surfaces thereof, the piezoelectric element vibrating in a thickness shear mode, and a damping member having a predetermined hardness disposed on one of the surfaces of the piezoelectric substrate so as to cover the vibrating electrode provided thereon.

Due to the structure of the above-described piezoelectric component, desired electrical characteristics are achieved by arranging the damping member having an appropriate hardness on only one surface of the piezoelectric substrate. More specifically, when a damping member having a Shore hardness of about 35 to about 80 is used, attenuation characteristics and group delay characteristics satisfying the required standard for a trap filter can be achieved by arranging the damping member on only one surface of the piezoelectric substrate.

Furthermore, when the damping member having a Shore hardness of about 80 to about 100 is used, distortion rate characteristics satisfying the required standard for a discriminator can be achieved by arranging the damping member on only one surface of the piezoelectric substrate.

Other features, elements, characteristics and advantages of the present invention will become apparent from the following description of preferred embodiments of the present invention which refers to the accompanying drawings.

DETAILED DESCRIPTION OF PREFERRED EMBODIMENTS

Piezoelectric components according to preferred embodiments of the present invention will be described with reference to the attached drawings below.

Figure 1:
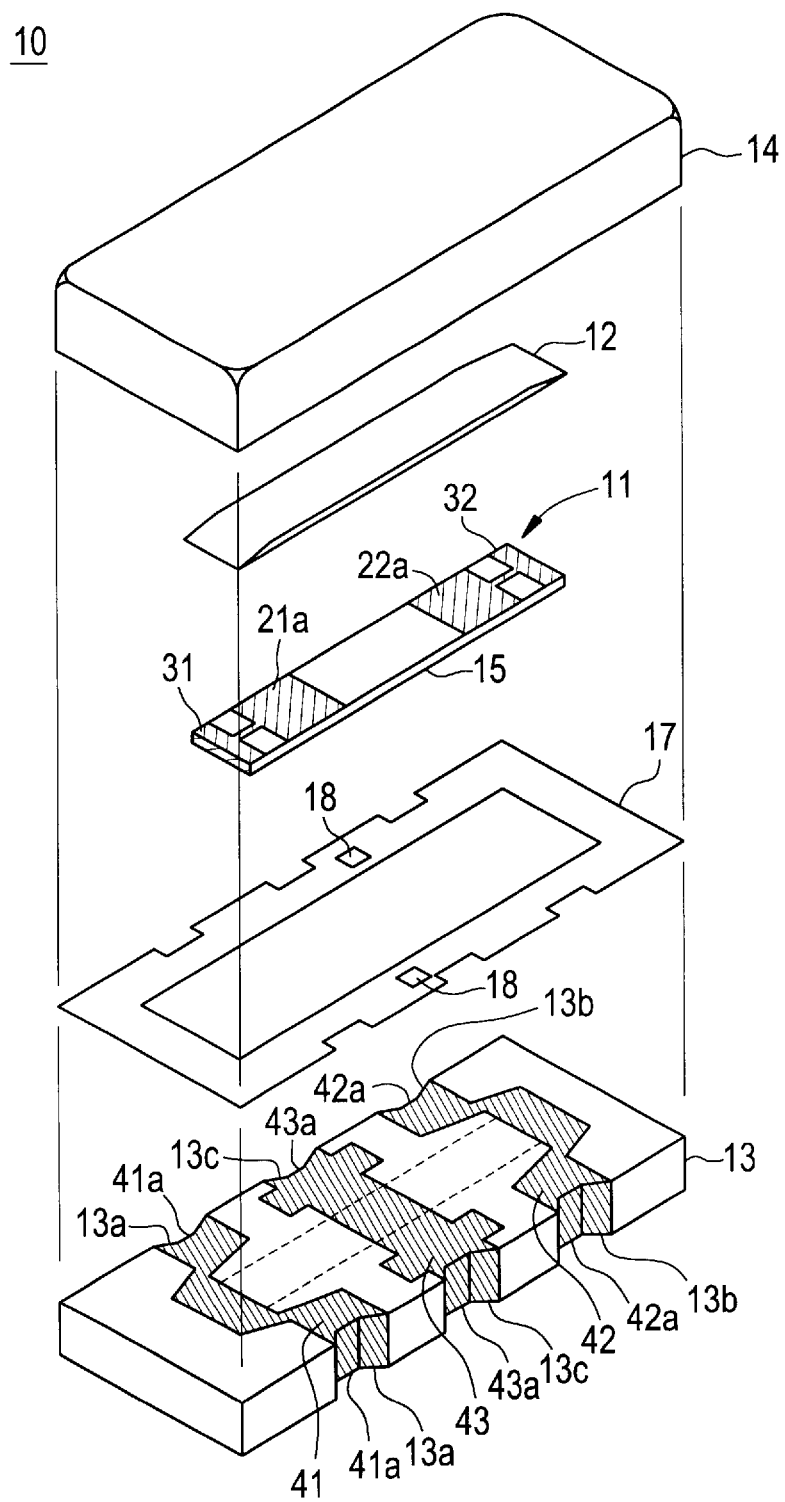
FIG. 1 is an assembly view of a piezoelectric component according to a first preferred embodiment of the present invention.

FIG. 1 shows a piezoelectric trap filter according to a first preferred embodiment of the present invention. A piezoelectric trap filter 10 preferably includes a piezoelectric element 11, a damping member 12, a supporting substrate 13 arranged to support the piezoelectric element 11, and a cover member 14 arranged to cover the piezoelectric element 11 on the supporting substrate 13.

Figure 2:
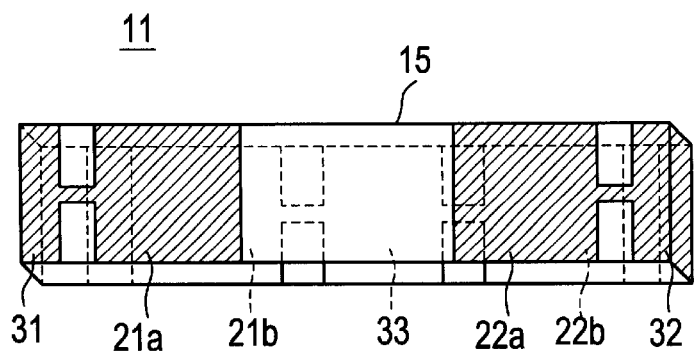
FIG. 2 is a perspective view of a piezoelectric element used in the piezoelectric component shown in FIG. 1.

FIG. 2 is a perspective view of a piezoelectric element 11 including a substantially rectangular piezoelectric substrate 15 such as PZT or other suitable substrate, two vibrating electrodes 21a and 22a provided on the top surface of the piezoelectric substrate 15, and two vibrating electrodes 21b and 22b provided on the bottom surface thereof. The vibrating electrodes 21b and 22b oppose the vibrating electrodes 21a and 22a, respectively, and sandwich the piezoelectric substrate 15 therebetween. On the left end portion of the piezoelectric substrate 15, a terminal electrode 31 is provided and extends from the top to the bottom surface. The terminal electrode 31 is connected to the vibrating electrode 21a. On the right end portion of the piezoelectric substrate 15, a terminal electrode 32 is provided and extends from the top to the bottom surface. The terminal electrode 32 is connected to the vibrating electrode 22a. Between the vibrating electrodes 21b and 22b provided on the bottom surface of the piezoelectric substrate 15, a terminal electrode 33 is provided. The terminal electrode 33 is connected to the vibrating electrodes 21b and 22b.

The supporting substrate 13, as seen in FIG. 1, is preferably made of an insulating material such as alumina, or other suitable insulating material. The supporting substrate 13 has electrodes 41 to 43 provided on the top surface thereof corresponding to the terminal electrodes 31 to 33, respectively, on the piezoelectric element 11. End portions 41a of the connecting electrode 41 extend within notches 13a provided on two edges of the supporting substrate 13. End portions 42a of the connecting electrode 42 extend within notches 13b provided on two edges of the supporting substrate 13. End portions 43a of the connecting electrode 43 extend within notches 13c provided on two edges of the supporting substrate 13.

Figure 3:
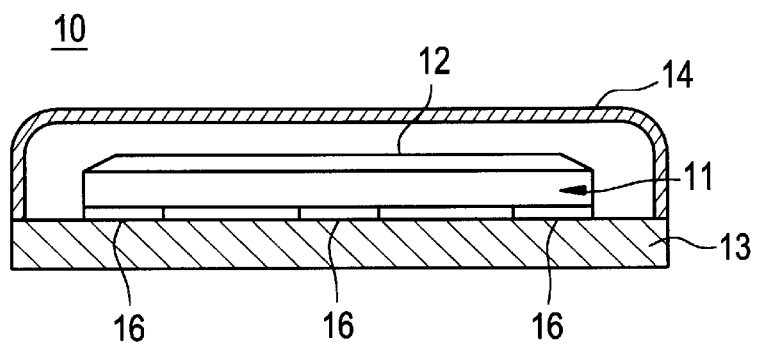
FIG. 3 is a longitudinal sectional view of the piezoelectric component shown in FIG. 1.

Conductive adhesive 16, as seen in FIG. 3, is provided on the connecting electrodes 41 to 43 of the supporting substrate 13 by printing, or other suitable methods. The terminal electrodes 31 to 33 on the piezoelectric element 11 are bonded to the connecting electrodes 41 to 43 via the adhesive 16. Thereby, the piezoelectric element 11 is attached to the supporting substrate 13, such that a gap created by the adhesive 16 is provided between the piezoelectric element 11 and the supporting substrate 12.

On the surface of the piezoelectric substrate 15, the damping member 12 is preferably made of a silicone rubber having a Shore hardness of about 35 to about 80 is arranged to cover the vibrating electrodes 21a and 22a by a method such as printing, or other suitable methods.

A glass paste film 17 is arranged around the periphery on the top surface of the supporting substrate 13 by printing, or other suitable methods. The cover member 14 made of a metallic material is bonded to the glass paste film 17 so as to cover the piezoelectric element 11. To provide grounding, the cover member 14 is electrically connected to the connecting electrode 43 through holes 18 provided on the glass paste film 17 with conductive adhesives, or other suitable connecting techniques. Thereby, the piezoelectric element 11 is electromagnetically shielded.

In the piezoelectric trap filter 10 described above, the damping member 12 dampens thickness shear vibration generated in the piezoelectric element 11 from the top surface on which the vibrating electrodes 21a and 22a are provided.

Figure 4:
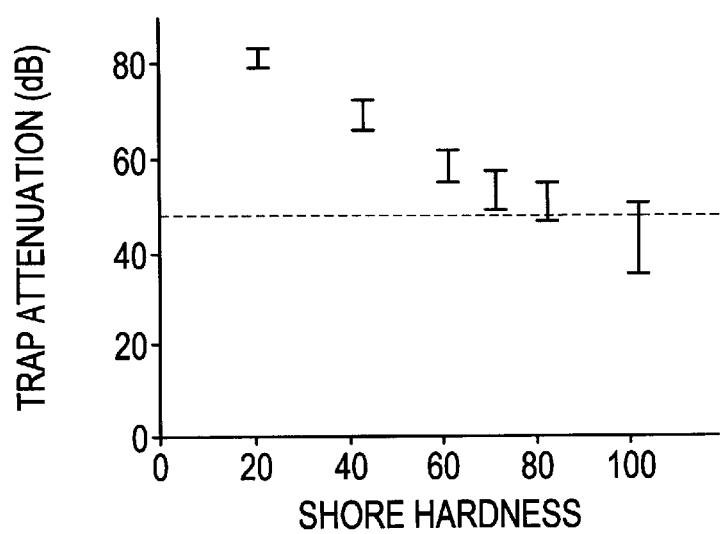
FIG. 4 is a graph showing variations in trap attenuation of the piezoelectric component shown in FIG. 1 relative to the hardness of the damping member.
Figure 5:
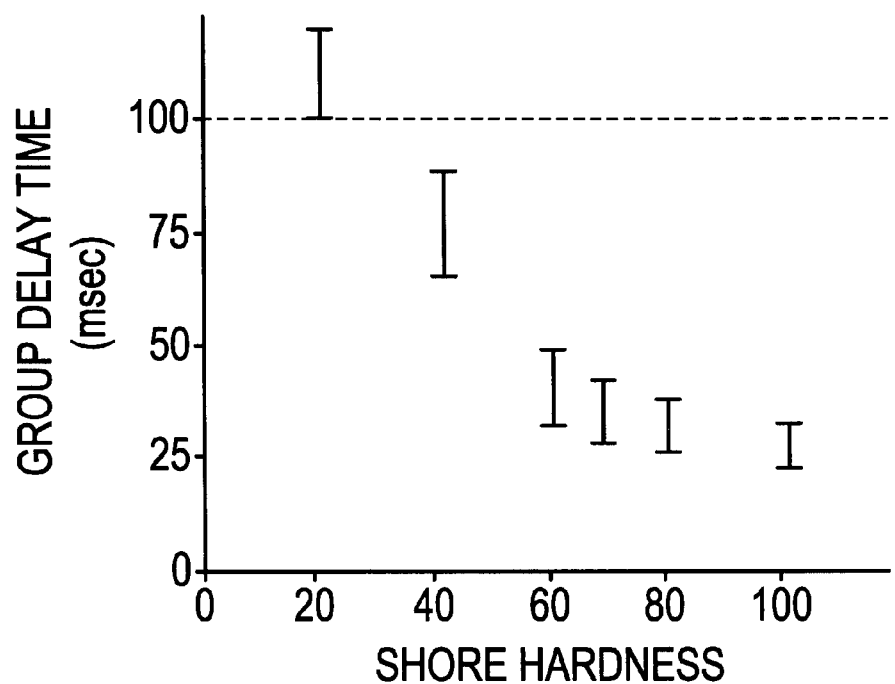
FIG. 5 is a graph showing the relationship between the group delay time characteristics of the piezoelectric component shown in FIG. 1 and the hardness of the damping member.

As shown in FIGS. 4 and 5, by using the damping member 12 preferably made of a material having a Shore hardness of about 35 to about 80, the piezoelectric trap filter 10 having in excess of about 50 dB of trap attenuation and a group delay time of below about 100 msec is achieved.

Figure 6:
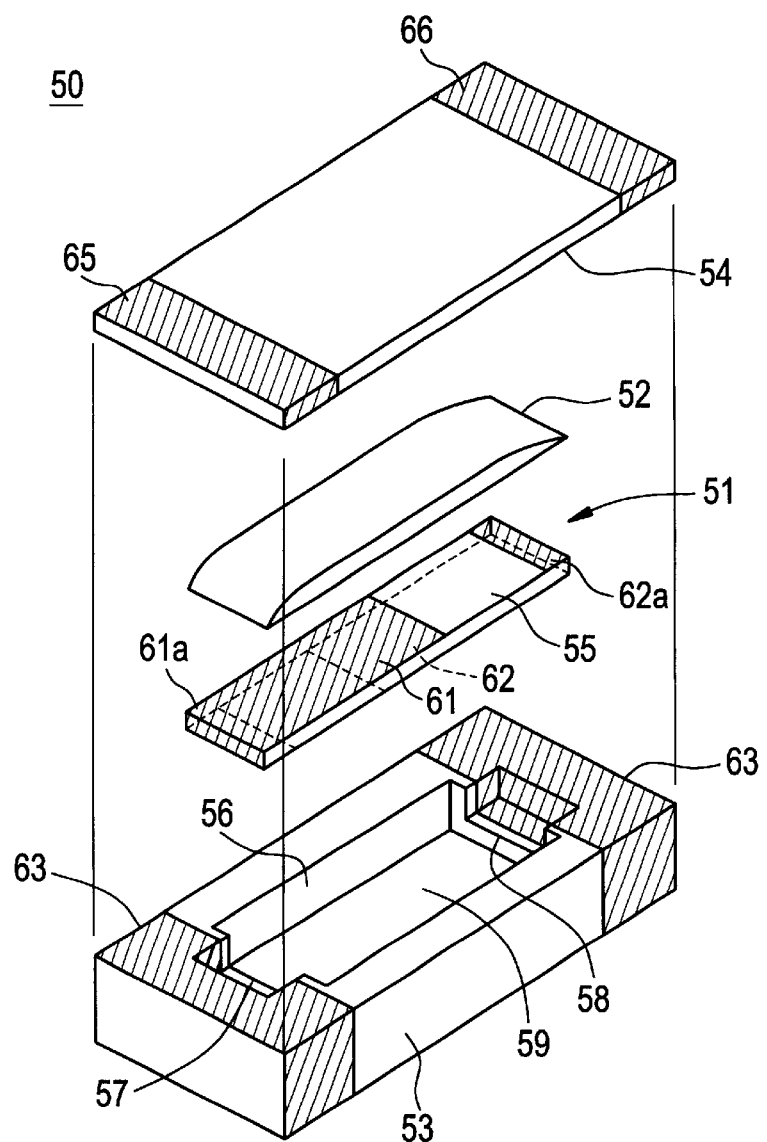
FIG. 6 is an assembly view of a piezoelectric component according to a second preferred embodiment of the present invention.

FIG. 6 shows a piezoelectric discriminator according to a second preferred embodiment of the present invention. A piezoelectric discriminator 50 includes a piezoelectric element 51, a damping member 52, a case 53 for accommodating the piezoelectric element 51, and a lid member 54 for shielding the opening on the top surface of the case 53.

The piezoelectric element 51 preferably includes a substantially rectangular piezoelectric substrate 55 having a vibrating electrode 61 provided on the top surface thereof and a vibrating electrode 62 provided on the bottom surface thereof. The vibrating electrodes 61 and 62 are located at an approximately central portion of the piezoelectric substrate 55 so as to oppose each other. An extending portion 61a of the vibrating electrode 61 extends from the top surface to the bottom surface of the left side of the piezoelectric substrate 55. An extending portion 62a of the vibrating electrode 62 extends from the bottom surface to the top surface on the right side of the piezoelectric substrate 55.

Figure 7:
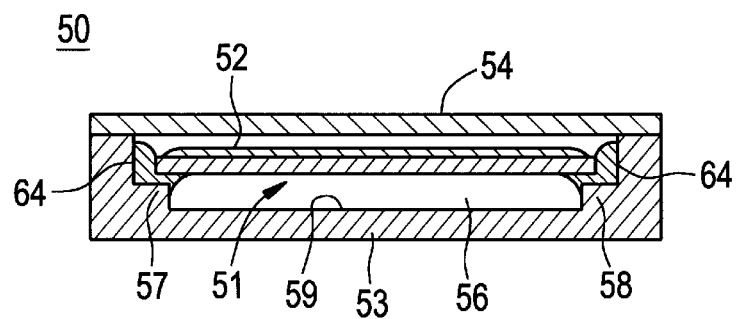
FIG. 7 is a longitudinal sectional view of the piezoelectric component according to the second preferred embodiment of the present invention.

The case 53 is formed of an insulating material such as alumina, or other suitable materials, and has a recessed portion 56 for accommodating the piezoelectric element 51. At end portions of the recessed portion 56, step portions 57 and 58 are provided for receiving the end portions of the piezoelectric element 51. FIG. 7 shows the step portions 57 and 58 which provide support for the piezoelectric element 51 such that a gap is provided between the vibrating portion of the piezoelectric element 51 and the top surface 59 of the recessed portion 56.

In the case 53, connecting electrodes 63 and 63 are arranged to extend from the respective step portions 57 and 58 to the outer peripheral surface of the case 53.

Conductive adhesive 64 is applied to the step portions 57 and 58 such that the extending portions 61a and 62a of the vibrating electrodes 61 and 62 in the piezoelectric element 51 are electrically connected to the connecting electrodes 62 and 63 via the conductive adhesive 64.

On the surface of the piezoelectric substrate 55, the damping member 52 preferably made of a silicone rubber having a Shore hardness of about 80 to about 100 is applied and covers the vibrating electrode 61 except the extending portion 61a.

The lid member 54 is bonded to the periphery of the top open surface of the case 53. In both end-portions of the lid member 54, connecting electrodes 65 and 66 are arranged to electrically connect to the connecting electrodes 62 and 63 of the case 53.

In the piezoelectric discriminator 50 described above, the damping member 52 dampens thickness shear vibration generated on the top surface of the piezoelectric element 51 by the vibrating electrode 62 provided thereon.

Figure 8:
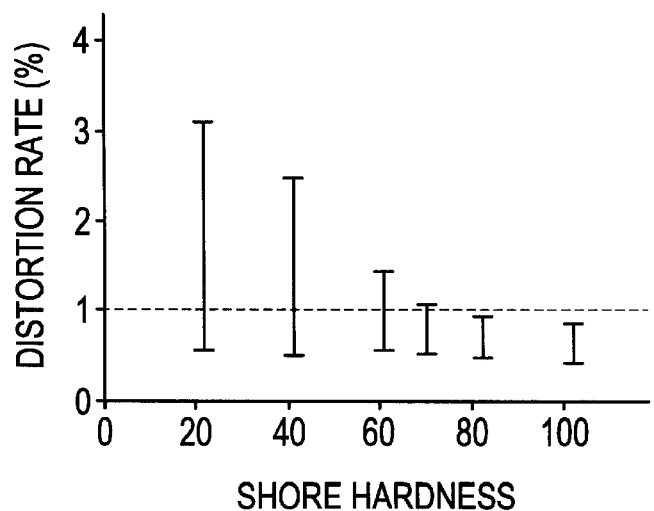
FIG. 8 is a graph showing the relationship between the distortion rate of the piezoelectric component shown in FIG. 6 and the hardness of the damping member.

As shown in FIG. 8, by using a material having a Shore hardness of about 80 to about 100 as the damping member 52, the piezoelectric discriminator 50 having a distortion rate of below one can be obtained.

Figure 9:
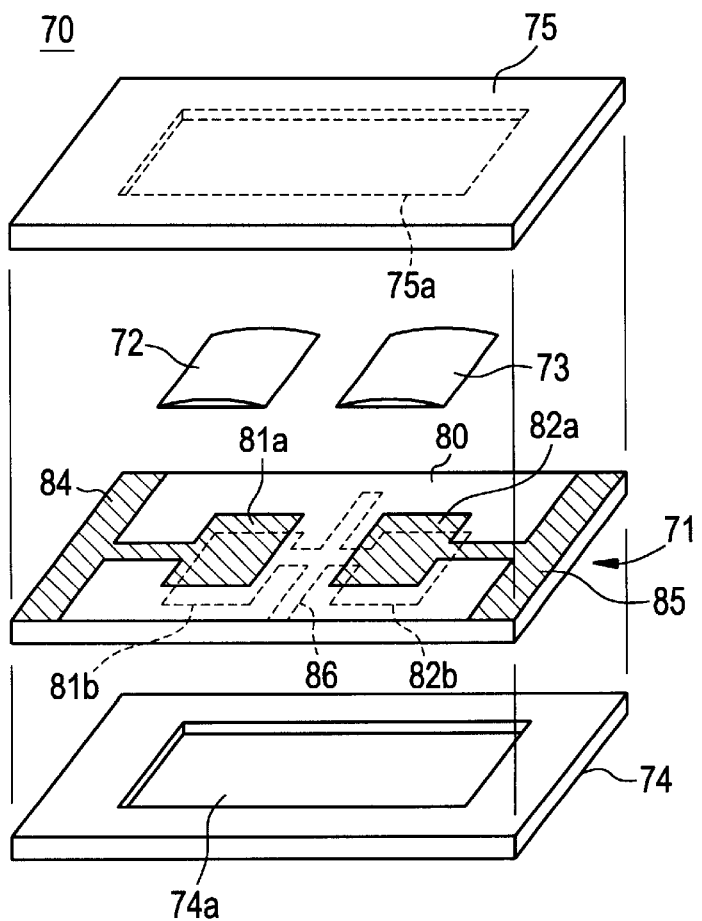
FIG. 9 is an assembly view of a piezoelectric component according to a third preferred embodiment of the present invention.

FIG. 9 shows a piezoelectric trap filter according to a third preferred embodiment of the present invention. A piezoelectric trap filter 70 includes a piezoelectric element 71 and protective substrates 74 and 75 which sandwich the piezoelectric element 71 therebetween to produce vibrating spaces.

The piezoelectric element 71 preferably includes a piezoelectric substrate 80 having vibrating electrodes 81a and 82a provided on the top surface thereof. On the bottom surface of the piezoelectric substrate 80, vibrating electrodes 81b and 82b are arranged to oppose the vibrating electrodes 81a and 82a, respectively. On the left end portion of the piezoelectric substrate 80, an extending electrode 84 is provided and is connected to the vibrating electrode 81a. On the right end portion of the piezoelectric substrate 80, an extending electrode 85 is provided and is connected to the vibrating electrode 82a. Between the vibrating electrodes 81b and 82b, on the bottom surface of the piezoelectric substrate 80, an extending electrode 86 is provided and is connected to the vibrating electrodes 81b and 82b.

On the top surface of the piezoelectric substrate 80, damping members 72 and 73 preferably made of a silicone rubber having a Shore hardness of about 35 to about 80 are applied by a method such as printing, or other suitable methods. The damping members 72 and 73 cover the vibrating electrodes 81a and 82a. At the approximately central portions of the protective substrates 74 and 75, recessed portions 74a and 75a are disposed to provide a vibrating space. The protective substrates 74 and 75 are preferably made of ceramics, a resin material, or other suitable materials. Additionally, the recessed portions 74a and 75a can be eliminated, and the vibrating space may be provided via the thickness of the adhesives used to bond the protective substrates 74 and 75 to the piezoelectric element 71.

Figure 10:
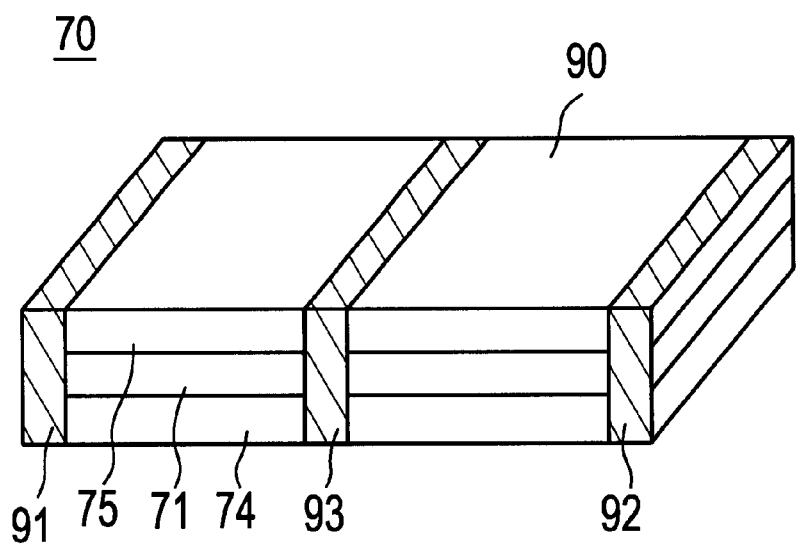
FIG. 10 is a perspective view showing an external appearance of the piezoelectric substrate shown in FIG. 9.

The protective substrates 74 and 75 are attached to the piezoelectric element 71 via the adhesive. In this manner, as shown in FIG. 10, a monolithic body 90 having vibrating spaces enclosed within is produced. External electrodes 91 and 92 are provided on the end portions of the monolithic body 90. Further, an external electrode 93 is provided at the approximately central portion of the monolithic body 90. The external electrodes 91, 92, and 93 are electrically connected to the extending electrodes 84, 85, and 86, respectively.

The piezoelectric trap filter 70 described above achieves the same results as the piezoelectric trap filter 10 according to the first preferred embodiment of the present invention.

The present invention is not limited to the abovementioned preferred embodiments and various modifications may be made without departing from the scope of the present invention. For example, the piezoelectric element 11 of the trap filter according to the first preferred embodiment of the present invention may be accommodated in the case 53 in the second preferred embodiment, or the piezoelectric element 51 in the second preferred embodiment of the present invention may be conversely placed on the supporting substrate 13 in the first preferred embodiment. Furthermore, the damping member may be applied to the bottom surface of the piezoelectric substrate instead to the top surface thereof.

As understood from the above description, according to the preferred embodiments of the present invention, since the damping member having a predetermined hardness is applied to one of the surfaces of the piezoelectric substrate to thereby dampen the thickness shear vibration of the piezoelectric element to obtain required electrical characteristics, the number of processes for applying the damping member is greatly reduced so as to simplify manufacturing and produce low-cost piezoelectric components.

For example, when the damping member having a Shore hardness of about 35 to 80 about is used, attenuation characteristics and group delay of a trap are achieved. Therefore, these traps can be efficiently produced by providing the damping member on only one surface of the piezoelectric substrate.

Moreover, when the damping member having a Shore hardness of about 80 to about 100 is used, distortion rate characteristics of a discriminator are achieved. Therefore, discriminators can be efficiently produced by providing the damping member on only one surface of the piezoelectric substrate.

While the invention has been particularly shown and described with reference to preferred embodiments thereof, it will be understood by those skilled in the art that the forgoing and other changes in form and details may be made therein without departing from the scope of the invention.

What is claimed is:

1. A piezoelectric component comprising:
    a piezoelectric element including a piezoelectric substrate having a plurality of vibrating electrodes provided on a first surface and a second surface thereof, said piezoelectric element vibrating in a thickness shear vibration mode; and
    at least one damping member having a predetermined hardness provided on one of said first and second surfaces of the piezoelectric substrate so as to cover the vibrating electrode disposed thereon.

2. A piezoelectric component according to claim 1, wherein said damping member has a Shore hardness of about 35 to about 80.

3. A piezoelectric component according to claim 1, wherein said damping member has a Shore hardness of about 80 to about 100.

4. A piezoelectric component according to claim 1, wherein at an end portion of said piezoelectric element, a first terminal electrode is attached to one of said plurality of vibrating electrodes, said first terminal electrode extends from the first surface to the second surface of the piezoelectric element, and at the other end portion of said piezoelectric element, a second terminal electrode is attached to another of said plurality of vibrating electrodes, said second terminal electrodes extends from the second surface to the first surface of the piezoelectric element.

5. A piezoelectric component according to claim 4, further comprising a supporting substrate having a plurality of connecting electrodes, two of said plurality of connecting electrodes corresponding to locations of said first and second terminal electrodes of said piezoelectric element.

6. A piezoelectric component according to claim 5, wherein a conductive adhesive is provided between said supporting substrate and said piezoelectric element to provide a gap therebetween.

7. A piezoelectric component according to claim 5, including a metallic cover, a glass paste film mounted on the supporting substrate and having through holes therein to enable electrical connection between said metallic cover and said connecting electrodes, said cover being electrically connected to at least one of said plurality of connecting electrodes.

8. A piezoelectric component according to claim 1, further comprising an insulating case having a recessed portion for accommodating said piezoelectric element, and step portions are provided at the end portions of said recessed portion to support end portions of said piezoelectric element.

9. A piezoelectric component according to claim 8, wherein said step portions are arranged to provide a gap between the top surface of said piezoelectric element and the top surface of said recessed portion.

10. A piezoelectric component according to claim 8, wherein a conductive adhesive is provided in the step portions of said insulating case to attach the piezoelectric element to the insulating case.

11. A piezoelectric component according to claim 8, further comprising connecting electrodes provided at end portions of said insulating case, a lid member having connecting electrodes at end portions of the lid member, wherein the lid member is attached to the insulating case such that the connecting electrodes of the lid member contact the connecting electrodes of the insulating case.

12. A piezoelectric component according to claim 1, further comprising at least two of said damping members.

13. A piezoelectric component comprising:
    a piezoelectric eleme nt including a piezoelectric substrate having a plurality of vibrating electrodes provided on a first surface and a second surface thereof, and terminal electrodes at the ends of said piezoelectric substrate, said piezoelectric element vibrating in a thickness shear mode;

at least one damping member having a predetermined hardness provided on one of said first and second surfaces of the piezoelectric substrate so as to cover the vibrating electrode disposed thereon;

a case having connecting electrodes at the ends thereof and containing the piezoelectric substrate; and a cover having connecting electrodes at the ends thereof and attached to the case;

wherein the terminal electrodes of said piezoelectric element and the connecting electrodes of said case and said cover are electrically connected to one another.

14. A piezoelectric component according to claim 13, wherein said at least one damping member has a Shore hardness of about 35 to about 80.

15. A piezoelectric component according to claim 13, wherein said case includes a recessed portion, and step portions at the end portions of said recessed portion to support end portions of said piezoelectric element.

16. A piezoelectric component according to claim 15, wherein said step portions are arranged to provide a gap between the top surface of said piezoelectric element and the top surface of said recessed portion.

17. A piezoelectric component according to claim 15, wherein a conductive adhesive is provided in the step portions of said insulating case to attach the piezoelectric element to the insulating case.

18. A piezoelectric component according to claim 13, further comprising at least two of said damping members provided on said piezoelectric substrate and each having a Shore hardness of about 35 to about 80.

* * * * *